(12) United States Patent
Tissafi Drissi

(10) Patent No.: US 11,538,519 B2
(45) Date of Patent: Dec. 27, 2022

(54) METHOD OF ADJUSTING A READ MARGIN OF A MEMORY AND CORRESPONDING DEVICE

(71) Applicant: STMicroelectronics SA, Montrouge (FR)

(72) Inventor: Faress Tissafi Drissi, Crolles (FR)

(73) Assignee: STMICROELECTRONICS SA, Montrouge (FR)

( * ) Notice: Subject to any disclaimer, the term of this patent is extended or adjusted under 35 U.S.C. 154(b) by 104 days.

(21) Appl. No.: 17/011,634

(22) Filed: Sep. 3, 2020

(65) Prior Publication Data

US 2021/0074352 A1 Mar. 11, 2021

(30) Foreign Application Priority Data

Sep. 9, 2019 (FR) ........................................ 1909892

(51) Int. Cl.
*G11C 11/419* (2006.01)
(52) U.S. Cl.
CPC .................. *G11C 11/419* (2013.01)
(58) Field of Classification Search
CPC ..................................................... G11C 11/419
USPC ......................................................... 365/154
See application file for complete search history.

(56) References Cited

U.S. PATENT DOCUMENTS

| 9,685,209 | B1 | 6/2017 | Dhori et al. | |
| 2004/0095800 | A1 | 5/2004 | Lin et al. | |
| 2015/0206565 | A1 | 7/2015 | Aoki | |
| 2016/0342494 | A1 | 11/2016 | Yang et al. | |
| 2018/0102163 | A1* | 4/2018 | Lin | ............... G09C 1/00 |
| 2019/0058603 | A1* | 2/2019 | Lin | ............ G11C 11/4076 |
| 2020/0005841 | A1* | 1/2020 | Tsai | ............ G11C 11/4094 |
| 2020/0294564 | A1* | 9/2020 | Baek | ............... G11C 11/419 |

OTHER PUBLICATIONS

Abu-Rahma et al., "Reducing SRAM Power Using Fine-Grained Wordline Pulsewidth Control," *IEEE Transactions On Very Large Scale Integration (VLSI) Systems* 18(3):356-364, Mar. 2010.
Arslan et al., "Variation-Tolerant SRAM Sense-Amplifier Timing Using Configurable Replica Bitlines," IEEE 2008 Custom Integrated Circuits Conference, Sep. 21-24, 2008, San Jose, CA, pp. 415-418.
Komatsu et al., "A 40-nm Low-power SRAM with Multi-stage Replica-bitline Technique for Reducing Timing Variation," IEEE 2009 Custom Integrated Circuits Conference, Sep. 13-16, 2009, Rome, Italy, pp. 701-704.

(Continued)

*Primary Examiner* — Sung Il Cho
(74) *Attorney, Agent, or Firm* — Seed Intellectual Property Law Group LLP

(57) ABSTRACT

Methods and devices for adjusting a read threshold voltage of bitlines are provided. One such method includes adjusting a read threshold voltage of bitlines coupled to memory points of a memory circuit. The read threshold voltage is initially set to a first value. First data are written in the memory points and second data are read from the memory points. The second data are compared to the first data, and the threshold voltage is decreased by a second value in response to a comparison error of one of the second data with the corresponding first data.

20 Claims, 8 Drawing Sheets

(56) References Cited

OTHER PUBLICATIONS

Li et al., "Robust activating timing for SRAM SA with replica cell voltage boosted circuit," *IEICE Electronics Express* 13(10):1-7, 2016.

Niki et al., "A Digitized Replica Bitline Delay Technique for Random-Variation-Tolerant Timing Generation of SRAM Sense Amplifiers," *IEEE Journal Of Solid-State Circuits* 46(11):2545-2551, Nov. 2011.

Osada et al., "Universal-Vdd 0.65-2.0V 32kB Cache using Voltage-Adapted Timing-Generation Scheme and a Lithographical-Symmetric Cell," 2001 IEEE International Solid-State Circuits Conference, Session 11, 3 pages.

* cited by examiner

METHOD OF ADJUSTING A READ MARGIN OF A MEMORY AND CORRESPONDING DEVICE

BACKGROUND

Technical Field

The present disclosure relates generally to memory circuits, and in particular volatile memories. In particular, the disclosure relates to methods for reading data written in the memory points of a memory circuit.

Description of the Related Art

A memory circuit, or memory, is an electronic device making it possible to store data. A memory is made up of memory points organized in a matrix. Memory points of a same row are generally all coupled to a row of words, and memory points of a same column are generally all coupled to one or several rows of bits. A memory further comprises control, read and write circuits.

The memories are used in a wide variety of electronic systems and devices. They may be costly to use in terms of energy and time.

It would be desirable to be able to improve, at least partially, certain aspects of known memory circuits.

BRIEF SUMMARY

There is a need for memory circuits whose read operations are faster.

There is a need for memory circuits whose read operations consume less energy.

One or more embodiments addresses all or some of the drawbacks of the known memory circuits.

One embodiment provides a method for adjusting a read threshold voltage of bitlines coupled to memory points of a memory, comprising the following steps: said threshold voltage is initially set to a first value; first data are written in said memory points; second data are read from said memory points; the second data are compared to the first data; and said threshold voltage is decreased by a second value upon each comparison error of one of said second data with the corresponding first datum.

According to one embodiment, the first data are written in a row of memory points.

According to one embodiment, the first data are written successively in all of the rows of memory points of the memory.

According to one embodiment, the first data are successively equal to the following data: a series of binary "0"; an alternation of binary "0" and "1"; an alternation of binary "1" and "0"; a succession of binary "1".

Another embodiment provides a method for reading at least one datum written in a memory point of a matrix according to which a read threshold voltage is set by the adjusting method previously described.

Another embodiment provides a control circuit of a memory configured to carry out the method previously described.

Another embodiment provides a read and write circuit of a memory configured to carry out the method previously described.

Another embodiment provides a memory comprising a control circuit previously described and a read and write circuit previously described.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

The signals mentioned in the present description are analog signals comprising a high state and a low state respectively corresponding to logic data "1" and "0". Unless otherwise stated, the high state represents a level equal to a supply voltage. Unless otherwise stated, the low state represents a level equal to a reference voltage, for example the ground.

Figure 1:
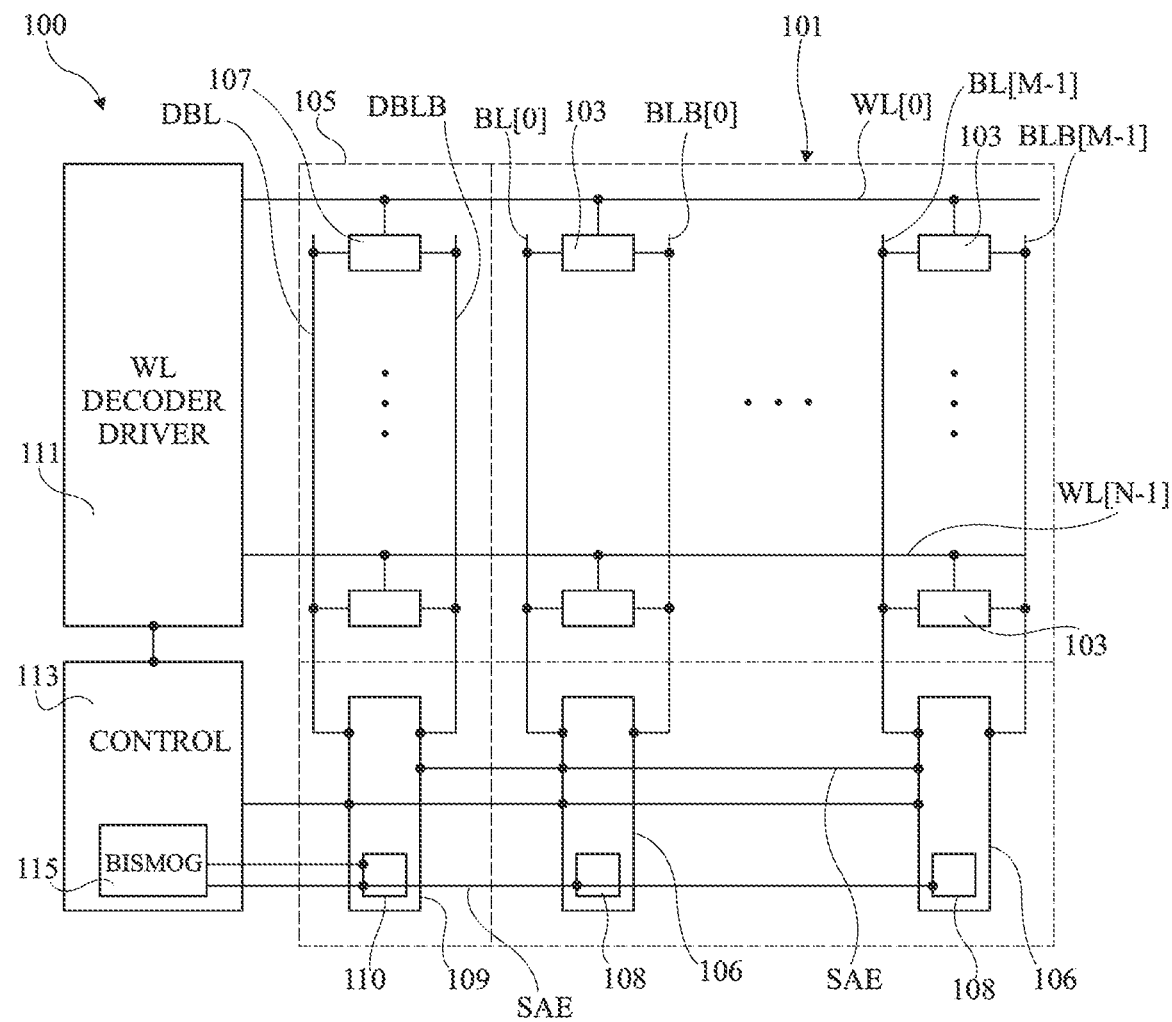
FIG. 1 schematically shows an embodiment of a memory comprising a circuit for adjusting a read threshold voltage.

FIG. 1 schematically shows a structure of an embodiment of a memory circuit, or memory, 100. The memory 100 is for example a volatile memory, for example a static random-access memory (SRAM).

The memory 100 comprises a matrix 101 (delimited by dotted lines in FIG. 1) made up of memory devices 103, which may be referred to herein as memory points 103. The memory points 103 are for example latches. The matrix 101 comprises a number N of rows and a number M of columns.

All of the memory points 103 of a same row are coupled to a same line of words (WordLine) WL[0], . . . , or WL[N−1]. All of the memory points 103 of the same column are coupled to a first line of bits (BitLine) BL[0], . . . , or BL[M−1] and a second bitline BLB[0], . . . , or BLB[M−1]. More specifically, the first bitline BL[0], . . . , BL[M−1] is coupled to a first input of the latch forming the memory point 103, and the second bitline BLB[0], . . . , BLB[M−1] is coupled to a second input of the bitline forming the memory point 103, such that each bitline receives an inverse datum of the other bitline. The wordlines WL[0], . . . , WL[N−1] make it possible, inter alia, to select the line of a memory point 103 to be read or written. The bitlines BL[0], . . . , BL[M−1], and BLB[0], . . . , BLB[M−1] make it possible to write or read a datum in a memory point whose line is selected.

The memory 100 further comprises M write and read circuits 106, delimited by dotted lines in FIG. 1. Each circuit 106 is coupled to a column of the matrix 101 by means of one of the bitlines BL[0], . . . , BL[M−1], and the complementary bitline BLB[0], . . . , or BLB[M−1]. The circuits 106 make it possible, inter alia, to preload the bitlines BL[0], . . . , BL[M−1], and/or BLB[0], . . . , BLB[M−1] for read or write operations.

The circuits 106 further each comprise read and write circuitry 108, which may be referred to herein as a read and write module 108, in the adjustment phase. An exemplary embodiment and operation of the module 108 are described in relation with FIG. 8.

The memory 100 further comprises a column 105, delimited by dotted lines in FIG. 1, made up of memory points 107. The column 105 will be called dummy column hereinafter. The memory points 107 are identical to the memory points 103. The column 105 can comprise N memory points 107 as a column of the matrix 101, but can also comprise a different number of memory points 107. The dummy column 105 makes it possible, inter alia, to simulate the discharge of a column of memory points 103 during, for example, a read operation. The dummy column further makes it possible to activate a different number of memory points 107 to modify the discharge time of rows of bits of a column of memory points 103.

Like the memory points 103, each memory point 107 is coupled to two bitlines DBL and DBLB, each coupling an input of the latch forming the memory point 107. These bitlines are similar and have the same role as the bitlines BL[0], . . . , BL[M−1], and BLB[0], . . . , BLB[M−1]. Additionally, the memory points 107 are organized in two parts. A first part is used to model the bitline load of a column of memory points 103, and a second part is used to model the discharge of bitlines of a column of memory points 103.

The memory 100 further comprises a control circuit 109 of the dummy column 105. The circuit 109 is coupled to the dummy column 105 by means of the bitlines DBL and DBLB. The circuit 109 has a role of detecting a discharge threshold of the dummy column 105, but also makes it possible, inter alia, to control the circuits 106. More specifically, the circuit 109 supplies a SAE (Sense-Amp Enable) control signal to the circuits 106.

The circuit 109 further comprises a threshold or reading margin management circuit 110 (which may be referred to herein as module 110). The module 110 is configured to supply control signals to the dummy column 105 in order to control the discharge speed of its bitlines.

The memory 100 further comprises a circuit 111 for controlling and decoding wordlines (WL DECODER DRIVER). The circuit 111 is coupled to all of the wordlines WL[0], . . . , WL[N−1]. The circuit 111 makes it possible, inter alia, to decode an address in order to select the appropriate wordline WL[0], . . . , WL[N−1], for example during a read or write operation.

The memory 100 further comprises a general control circuit 113 (CONTROL) of the memory. The circuit 113 supplies, inter alia, clock, addressing and control signals to the different circuits 106, the circuit 109 and the circuit 111.

The circuit 113 further comprises circuitry 115, which may be referred to herein as a module 115, for adjusting the read threshold or margin (BISMOG, Built In Self Memory Optimization Generator). The module 115 is more specifically configured to supply control signals to the modules 108, the module 110 and the circuit 111. An exemplary embodiment and the operation of the module 115 are described in relation with FIG. 7.

Figure 2:
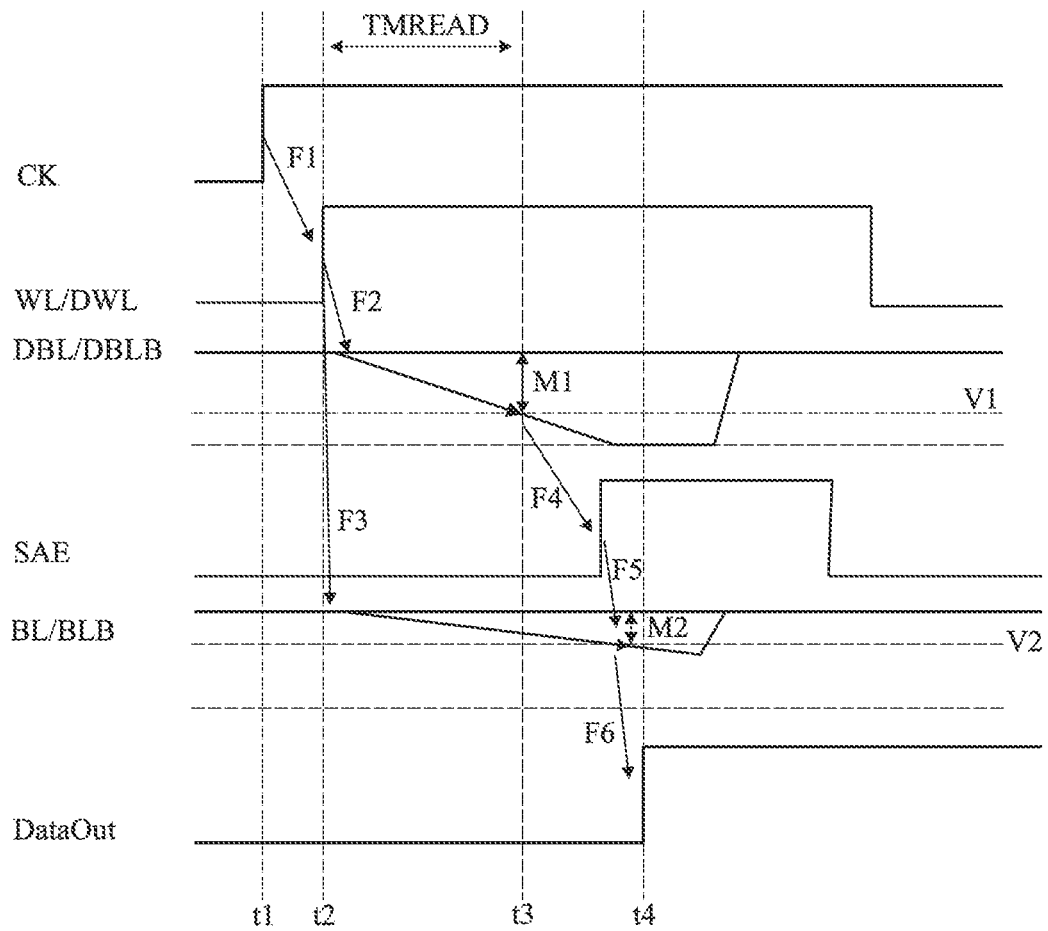
FIG. 2 shows a timing diagram illustrating the operation of a read operation.

The operation of a memory, and more specifically the working of a read operation of a datum stored in a memory point 103, is described in more detail in relation with FIG. 2.

FIG. 2 illustrates the working of a read operation of a memory point 103 of the memory 100 described in relation with FIG. 1.

FIG. 2 shows timing diagrams of control signals of the memory 100. More specifically, FIG. 2 comprises the timing diagrams of the following signals:

a clock signal CK sent by the general control circuit 113 to the circuits 106, 109 and 111;

signals DBL and DBLB coming from the bitlines DBL and DBLB associated with the dummy column 105;

the SAE control signal supplied by the circuit 109 to the circuits 106;

signals WL/DWL coming from the wordline WL[0], . . . , or WL[N−1] associated with the memory point 103 and the wordline associated with the memory point 107 of the dummy column 105;

signals BL and BLB coming from the bitlines BL[0], . . . , or BL[M−1], and BLB[0], . . . , or BLB[M−1] associated with the memory point whose datum is to be read; and a DataOut datum signal, or output signal of the circuit 106, associated with the column of the memory point 103.

By default, the bitlines are preloaded, and the signals DBL, DBLB, BL and BLB are in a high state. The SAE control signal is in a low state, the read operation not yet having started. The signal WL of the wordline is in a low state, the wordline of the memory point 103 is not selected. The data signal DataOut is in a low state.

At the moment t1, the clock signal CK goes from a low state to a high state. This rising edge of the clock signal CK announces the beginning of a read operation, and causes (arrow F1 in FIG. 2), at a moment t2, the transition from a low state to a high state of the wordline signal WL and the dummy wordline DWL. The activation of the dummy wordline DWL causes the discharge of the memory points 107 from the dummy column 105. This causes the discharge of the bitlines DBL/DBLB from the dummy column 105 (arrow F2 in FIG. 2). The selection of the wordline WL causes the discharge of one of the bitlines of the memory point 103 (arrow F3 in FIG. 2).

According to one embodiment, the clock signal can stay in a high state throughout the entire duration of the read operation, but, as a variant (see FIGS. 4 to 6), the clock signal can have a first pulse at the beginning of the operation, then return to a low state until the next operation.

Once one of the two signals DBL or DBLB reaches, at a moment t3, the level of a read threshold voltage V1, the signal SAE goes from a low state to a high state (arrow F4 in FIG. 2). The threshold voltage V1 is below a voltage level of a high state and above or equal to a voltage level of a low state. The difference between the voltage level of a high state and the threshold voltage level V1 is a margin denoted M1. Hereinafter, the read margin will refer to the duration TMREAD necessary for one of the wordlines DBL or DBLD to reach the voltage V1 after the activation of the wordline DWL. Thus, in FIG. 2, the duration TMREAD is equal to the duration between the moments t2 and t3.

The activation of the signal SAE makes it possible to start the reading of the bitlines associated with the memory point 103 by the dedicated circuit 106 (arrow F5 in FIG. 2). One of the signals BL or BLB decreases to a value V2 that allows the reading of the datum of the memory point. The voltage difference between the signals BL and BLB, called margin M2, is read by the circuit 106. The circuit 106 deduces from the reading of the margin M2, and the bitline BL or BLB, the datum written in the memory point 103.

At a moment t4, the circuit 103 inscribes, on the signal DataOut, the datum of the memory point (arrow F6 in FIG. 2). In FIG. 2, the datum of the memory point is a logic "1", and the signal DataOut goes from a low state to a high state. In practice (see FIGS. 4 to 6), the signal DataOut can be made up of more than one signal, for example, two complementary signals.

The value of the read threshold voltage V1, and therefore the value of the margin M1, are defined, during an adjustment phase, by the module 115 of the general control circuit 113. The shorter the duration TMREAD is, the smaller the margin M2 is, which increases the read error risk. The longer the duration TMREAD is, the lower the read voltage V2 is and the slower and more energy-consuming the read operation is.

The overall progression of an embodiment of an adjustment phase is as follows. The duration TMREAD necessary for the detection of the threshold voltage V1, or the margin M1, is initially set at an extreme value. More specifically, the duration TMREAD corresponds to the maximum authorized adjustment value. The threshold voltage V2 is set at a maximum value, in other words, the margin M1 is set at a low or minimum value. Different test data are written in memory points 103 of the memory 100, then read, by a reading operation similar to that disclosed in relation with FIG. 2, by using the duration TMREAD of the threshold voltage V1, or the margin M1. The read test datum is compared to the written test datum, and, each time the read test datum does not correspond to the written test datum, the duration TMREAD is increased. In other words, the read threshold voltage V1 is detected later and the read margin M1 is increased. This process is carried out on all of the memory points 103 of the memory 100. The read threshold voltage value, or read margin value, ultimately obtained is next stored and used for the conventional read operations of the memory 100.

The progression of the adjustment phase is disclosed in more detail in relation with FIGS. 3 to 6.

Figure 3:
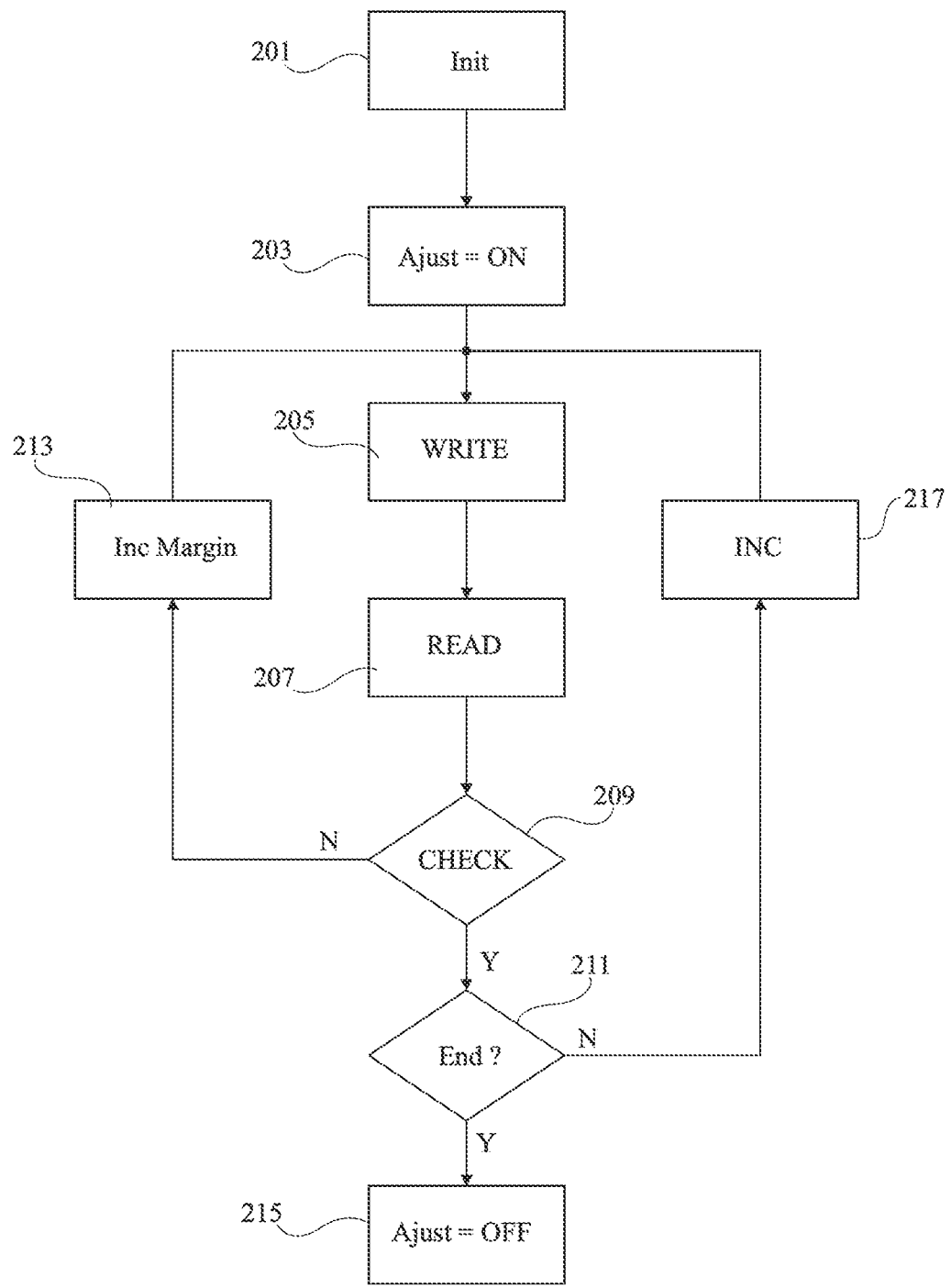
FIG. 3 shows a flowchart illustrating steps of one embodiment of a method for adjusting a read threshold voltage.

FIG. 3 is a flowchart illustrating the operation of an embodiment of an adjustment phase of the read margin TMREAD, as well as the threshold voltage V2 or the margin M2.

Figure 4:
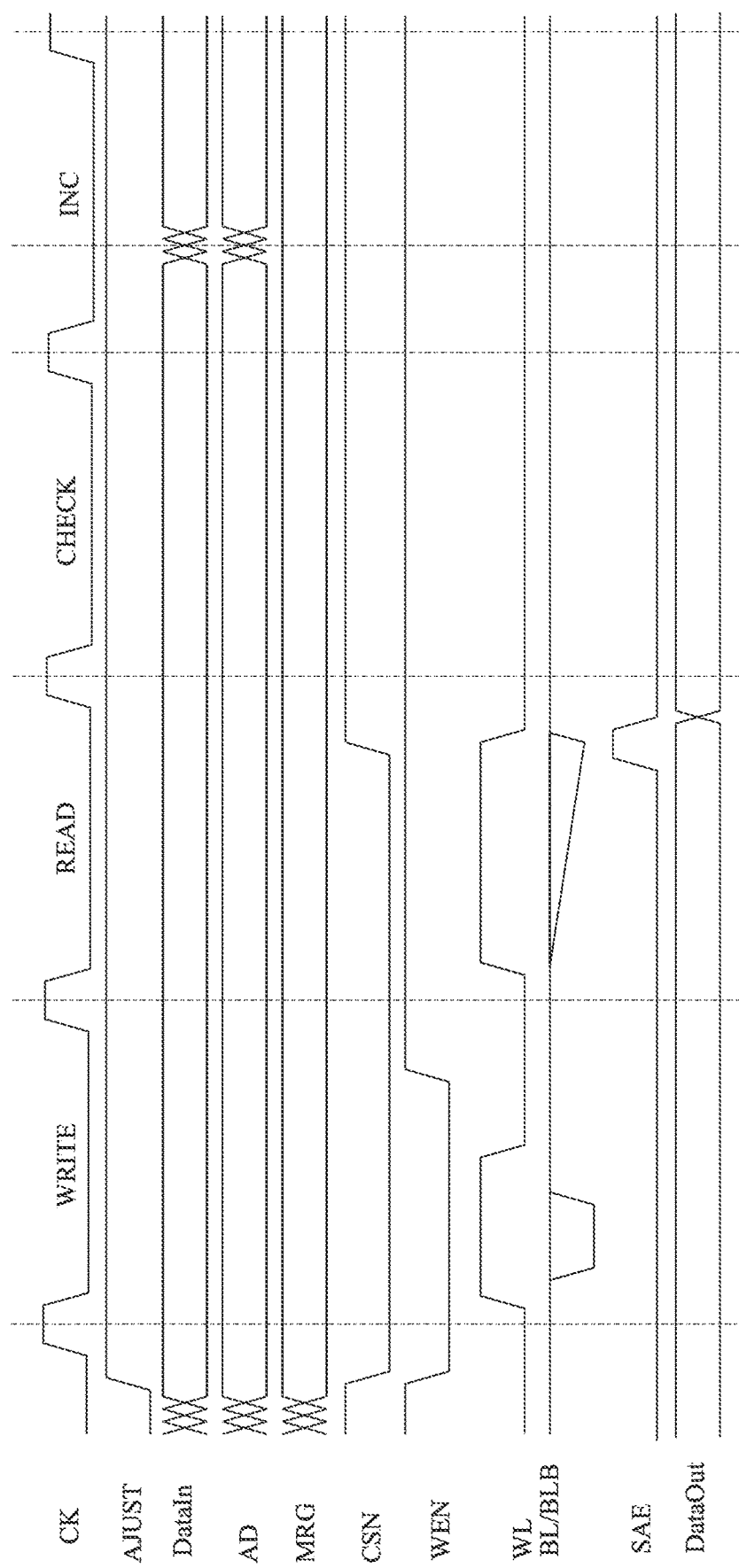
FIG. 4 shows a timing diagram illustrating the operation of the method of FIG. 3.
Figure 5:
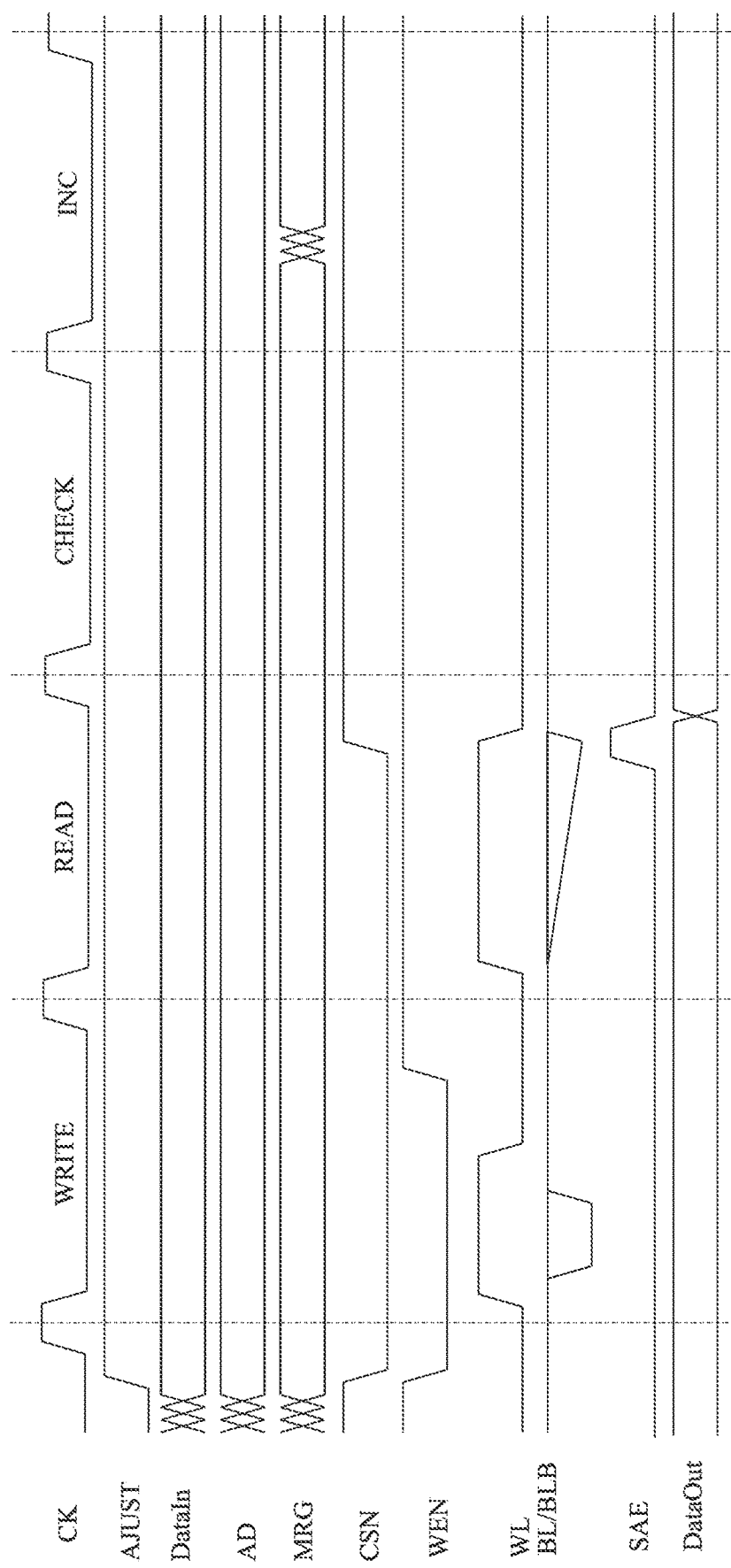
FIG. 5 shows a timing diagram illustrating the operation of the method of FIG. 3.
Figure 6:
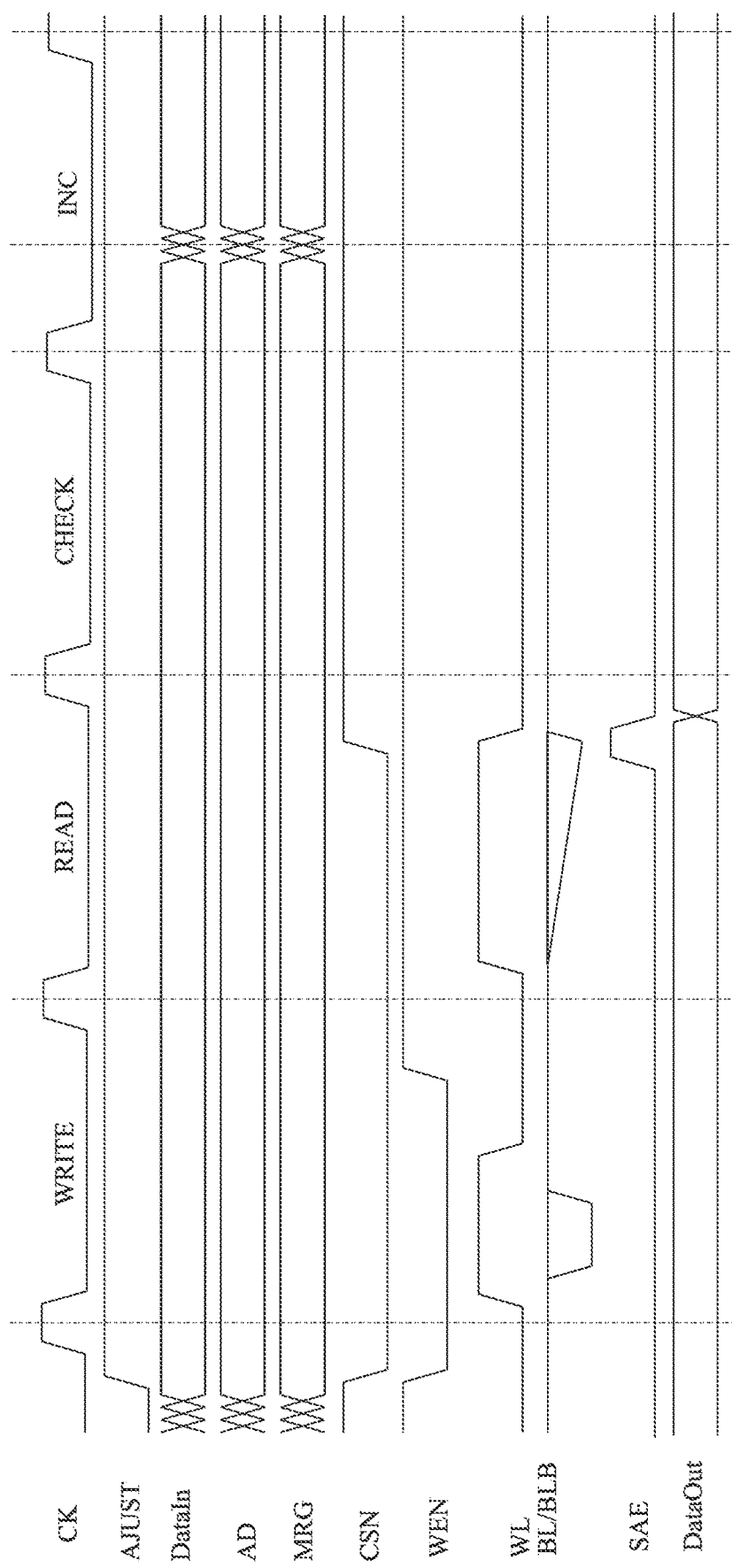
FIG. 6 shows a timing diagram illustrating the operation of the method of FIG. 3.

FIGS. 4 to 6 are timing diagrams representing control signals supplied by the module 115 and several configurations of the adjustment phase described in relation with FIG. 3. FIGS. 4 to 6 more specifically comprise timing diagrams of the following signals:

the clock signal CK;

a signal AJUST signifying the activation of an adjustment phase, and supplied by the module 115 to the modules 108 and the module 110;

data signals DataIn supplied by the module 115 to the modules 108 and the module 110;

addressing signals AD supplied [by] the circuit 113 to the circuit 111 and the circuits 106;

a configuration signal of the read threshold MRG supplied by the module 115 to the module 110;

an activation signal CSN of the memory 100;

a write and read signal WEN;

the signal WL coming from a wordline WL[0], . . . , or WL[N−1];

the signals BL and BLB coming from the bitlines BL[0], . . . , or BL[M−1], and BLB[0], . . . , or BLB[M−1];

the control signal SAE; and the data signals DataOut, or output signals of the circuits 106.

In an initial step 201 (Init, FIG. 3), the memory 100 is ready to enter an adjustment phase. More specifically, the memory 100 is ready to have all of the data that it stores replaced by test data. As an example, the memory 100 is at the end of manufacturing, in a startup phase, or in a reset phase.

In this step, the aforementioned signals (FIGS. 4 to 6) are in the following states:

the clock signal CK is in a low state;

the signal AJUST is in a low state;

the data signals DataIn are randomly either in a low state, or in a high state;

the addressing signals AD are randomly either in a low state, or in a high state;

the configuration signals of the read threshold MRG are randomly either in a low state, or in a high state;

the activation signal CSN is in a high state;

the write signal WEN is in a high state;

the signal WL is in a low state, the wordline is not selected;

the signals BL and BLB are in a high state, the bitlines are preloaded;

the control signal SAE is in a low state; and the data signals DataOut are randomly either in a low state, or in a high state.

In a step 203 (Ajust=ON, FIG. 3), the phase for adjusting the read margin begins. The signal AJUST (FIGS. 4 to 6) goes from a low state to a high state, and stays in a high state throughout the entire duration of the adjustment phase. The memory 100 is selected, the signal CSN transitions to a low state. The memory 100 prepares itself, more specifically, for a write operation, the signal WEN transitions to a low state. The signals DataIn, AD and MRG set themselves at a value.

The value of the read margin TMREAD is set at a low or minimum duration TMREADmin, and the value of the voltage V2 is close, and in some cases as close as possible or practical, to the voltage value in the high state, or in other words, the read margin M2 is set at the smallest possible or smallest practical minimum value M2min.

In a step 205 (WRITE, FIGS. 3 to 6), the clock signal CK has a first rising edge that triggers a write operation. More specifically, a line WL[0], ..., or WL[N−1] of memory points 103 is selected and data are written in these memory points. As an example, these data can be the following:

a "0" in all of the memory points 103 of the line;

alternatively a "0" and a "1" in all of the memory points 103 of the line;

alternatively a "1" and a "0" in all of the memory points 103 of the line; or a "1" in all of the memory points 103 of the line.

The addresses of said memory points are stored in the addressing signals AD. To perform this write operation, the bitline WL[0}, ..., or WL[N−1] is selected; to that end, the signal WL goes to a high state. The level of the signals BL and BLB is adapted as a function of the data to be written.

At the end of the write operation, the signals BL and BLB transition to a high state, the signal WL transitions to a low state, and the signal WEN transitions to a high state.

In a step 207 (READ, FIGS. 3 to 6), the clock signal CK has a second rising edge that triggers a read operation. The memory remains activated, the signal CSN remains in a low state. More specifically, the data written in the line WL[0], ..., or WL[N−1] of memory points are read by a read operation of the type described in relation with FIG. 2. As previously stated, in the first read operation, the threshold voltage value V2 is set at a high or in some cases the maximum threshold voltage V2max, or in other words, the read margin M2 is set at the minimum value M2min, owing to the duration TMREAD, set by the dummy column 105, at the minimum value TMREADmin.

The memory points 103 of the line WL[0], ..., or WL[N−1] are selected again. The signal WL transitions to a high state during the duration of the read operation. The signals BL and BLB, and the signal SAE, evolve in the manner described in relation with FIG. 2. The data read in the memory points are next stored in the signals DataOut.

At the end of the read step, the memory no longer needs to be activated, the signal CSN then transitions to a high level.

In a step 209 (CHECK, FIGS. 3 to 6), the clock signal has a third rising edge that triggers a comparison operation. The match between the data of the signals DataIn and DataOut is then checked.

Two situations may then occur. In the case where the data of the signals DataIn and DataOut are the same (output Y from the block CHECK in FIG. 3), the following step is a step 211 (End?, FIG. 3).

In the case where the data of the signals DataIn and DataOut are the not same (output N from the block CHECK in FIG. 3), the following step is a step 213 (INC Margin, FIG. 3). This situation is illustrated by the timing diagrams of FIG. 5.

In step 211, not illustrated in the timing diagrams of FIGS. 4 to 6, the memory determines whether all of the lines WL[0], ..., and WL[N−1] of memory points have been tested by checking the data of the signals DataIn and the address of the addressing signals AD.

If all of the lines WL[0], ..., and WL[N−1] of the memory points 103 have been tested (timing diagrams of FIG. 6), then the following step is a step 215 (Ajust=OFF, FIG. 3), in which the value of the final read margin is stored, and the data of the signal DataIn and the address of the addressing signals AD are reset. The signal AJUST transitions to a low state and the adjustment phase is ended.

If all of the lines WL[0], ..., or WL[N−1] of memory points 103 have not been tested, then the following step is a step 217 (INC, FIG. 3). This situation is illustrated by the timing diagrams of FIG. 4.

A fourth rising edge of the clock signal CK indicates the end of step 209 and, if applicable, step 211, and which triggers the starting of step 213 or step 217.

In step 213 (see FIG. 5), the circuits 106 detect a read error, the signals DataIn and DataOut are different. The read threshold configuration signals are incremented. This results in increasing the duration TMREAD and thus decreasing the voltage threshold V2 and increasing the margin M2 by a pitch defined by the designer. The following step is then the write step 205 during which the same test data are rewritten in the line WL[0], ..., or WL[N−1] of memory points and their writing is tested again.

In step 217, the circuits 106 do not detect a read error, the signals DataIn and DataOut are identical. Two situations are then profiled, either the data of the signals DataIn are incremented and the new datum is written in the memory points 103, or all of the aforementioned data combinations have been tested and one moves on to the writing in the following line WL[0], ..., or WL[N−1] of memory points, and in this case the addresses of the addressing signals AD are incremented.

One advantage of using an adjustment phase to set the threshold voltage or the read margin of a read operation is that such a phase makes it possible to supply a threshold voltage or a read margin minimizing the number of read errors, the time of a read operation, and the power dissipated by the memory.

Another advantage is that the use of this adjustment phase adapts to any memory size 100.

Another advantage is that the use of this adjustment phase is independent for each memory. Parallel adjustment phases can be launched on several memories of a same circuit.

Figure 7:
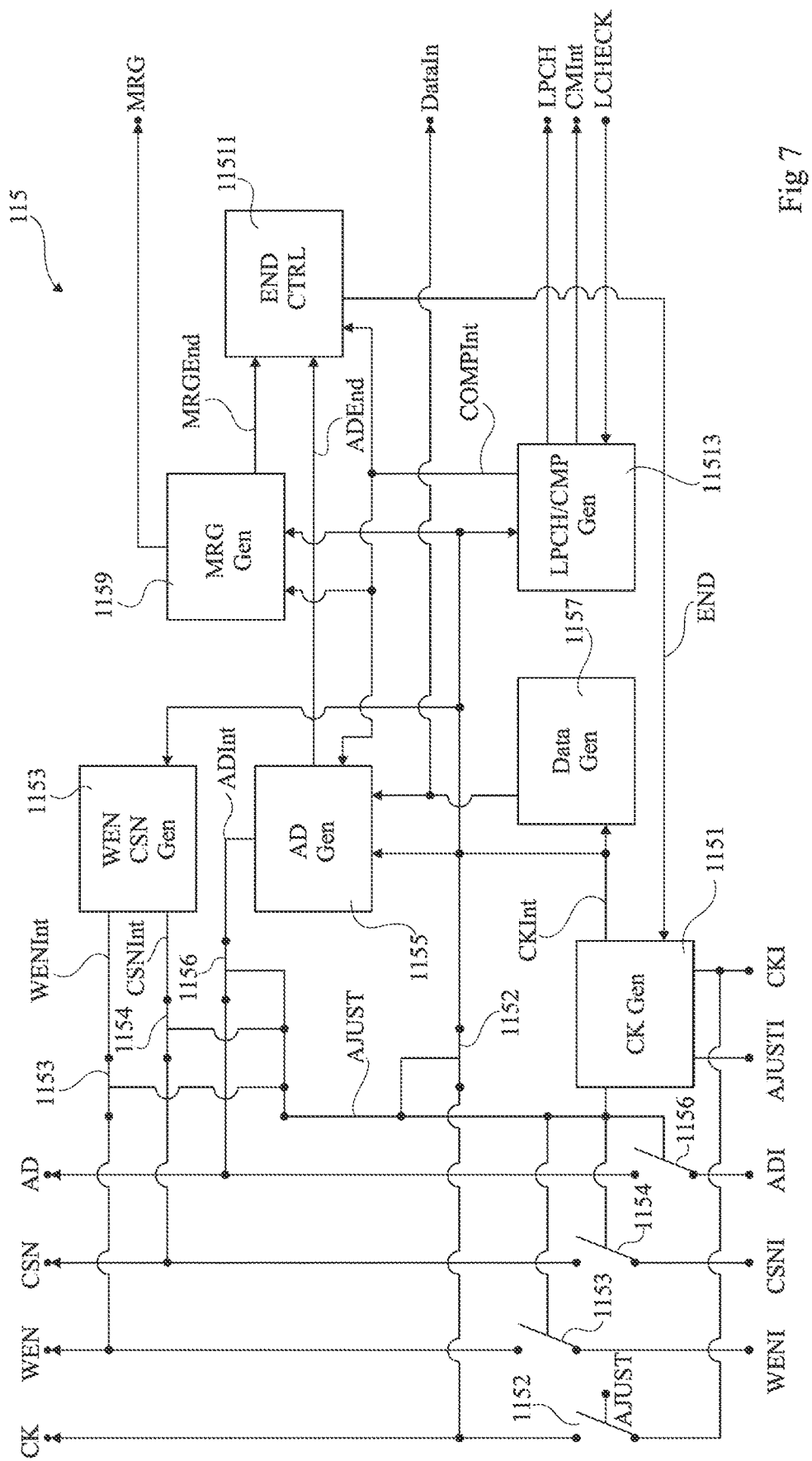
FIG. 7 shows an embodiment of a module of a control device of the memory of FIG. 1.

FIG. 7 shows, schematically and in block diagram form, an exemplary embodiment of a module 115 for adjusting a threshold or read margin comprised in the general control circuit 113 of the memory 100.

The module 115 is configured to receive, as input, the following signals:

an initial clock signal CKI;

an initial signal AJUSTI signifying the activation or non-activation of the adjustment phase;

initial addressing signals ADI;

an activation signal of the initial memory CSNI;

an initial write and read signal WENI; and a pre-loading check signal LCHECK.

The module 115 supplies the following signals as output:

the clock signal CK;

the addressing signals AD;

the activation signal of the memory CSN;

the write and read signal WEN;

the read threshold configuration signal MRG;

the data signals DataIn;

an internal comparison signal CMInt; and a pre-loading signal LPCH.

The module 115 comprises a circuit 1151 (CK Gen) for generating a clock signal and an activation signal of the adjustment phase. The circuit 1151 receives, as input, the initial clock signal CKI, the signal AJUST for activating the adjustment phase, and an adjustment phase end signal END. The circuit 1151 supplies, as output, an intermediate clock signal CKInt and the signal MUST for activating the adjustment phase. The circuit 1151 is more specifically configured, inter alia, to control the generation of the signal CKInt as a function of the state of the signals CKI and AJUSTI.

The final clock signal CK to be transmitted to the modules 110 and 106 can either be equal to the initial clock signal CKI, when the memory 100 is not in the adjustment phase, or be equal to the intermediate clock signal CKInt, when the memory 100 is in the adjustment phase. This is symbolized in FIG. 7 by the presence of switches 1152 controlled by the signal AJUST.

The module 115 further comprises a circuit 1153 (WEN CSN Gen) for generating an activation signal of the memory and a read and write signal. The circuit 1153 receives, as input, the clock signal CK from the circuit 1151, and supplies, as output, an activation signal of the intermediate memory CSNInt and an intermediate read and write signal WENInt. The circuit 1153 is more specifically configured, inter alia, to generate the signals CSNInt and WENInt configured to implement the adjustment phase described in relation with FIGS. 3 to 6.

Like for the final clock signal CK, the signals WEN and CSN can either be equal to the signals WENI and CSNI, when the memory is not in the adjustment phase, or be equal to the signals WENInt and CSNInt, when the memory is in the adjustment phase. This is symbolized in FIG. 7 by the presence of switches 1154 controlled by the signal AJUST.

The module 115 further comprises a circuit 1155 (AD Gen) for generating addressing signals. The circuit 1155 receives, as input, the intermediate clock signal CKInt, the data signals DataIn, and a comparison signal after writing COMPInt, and supplies, as output, intermediate addressing signals ADInt and an addressing end signal ADEnd. The circuit 1155 is more specifically configured to generate the different useful addresses during the implementation of the adjustment phase.

Like before, the final addressing signals AD can either be equal to the initial addressing signals ADI, when the memory 100 is not in the adjustment phase, or be equal to the intermediate addressing signals ADInt, when the memory 100 is in the adjustment phase. This is symbolized in FIG. 7 by the presence of switches 1156 controlled by the signal AJUST.

The module 115 further comprises a circuit 1157 (Data Gen) for generating data. The circuit 1157 receives, as input, the intermediate clock signal CKInt, and supplies, as output, the data signals DataIn. The circuit 1157 makes it possible to generate the data to be written in the memory points of the memory during the adjustment phase.

The module 115 further comprises a circuit 1159 (MRG Gen) for managing the read threshold voltage V2, or the duration TMREAD. The circuit 1159 receives, as input, the intermediate clock signal CKInt and the comparison signal after writing COMPInt, and supplies, as output, the configuration signals of the read threshold MRG and a read threshold configuration end signal MRGEnd. The circuit 1159 makes it possible to increment the value of the read threshold voltage, or the read margin, when necessary.

The module 115 further comprises an adjustment phase end management circuit 11511 (END CTRL). The circuit 11511 receives, as input, the comparison signal after reading COMPInt, the end of addressing signal ADEnd, and the end of reading threshold signal MRGEnd. The circuit 11511 supplies, as output, the end of adjustment phase signal END. The circuit 11511 makes it possible to establish the end of an adjustment phase by basing oneself on data sent by the addressing ADEnd, comparison COMPInt and read threshold configuration MRGEnd signals.

The module 115 further comprises a circuit 11513 (LPCH/CMP Gen) for controlling comparison circuits of the signals DataIn and DataOut. The circuit 11513 receives, as input, the intermediate clock signal CKInt, and a check signal LCHECK coming from the modules 108. The circuit 11513 supplies, as output, the comparison signal after reading COMPInt, the preloading signal LPCH of a match line, and the internal comparison signal CMInt.

The module 115 therefore makes it possible to manage the adjustment phase described in relation with FIGS. 3 to 6.

Figure 8:
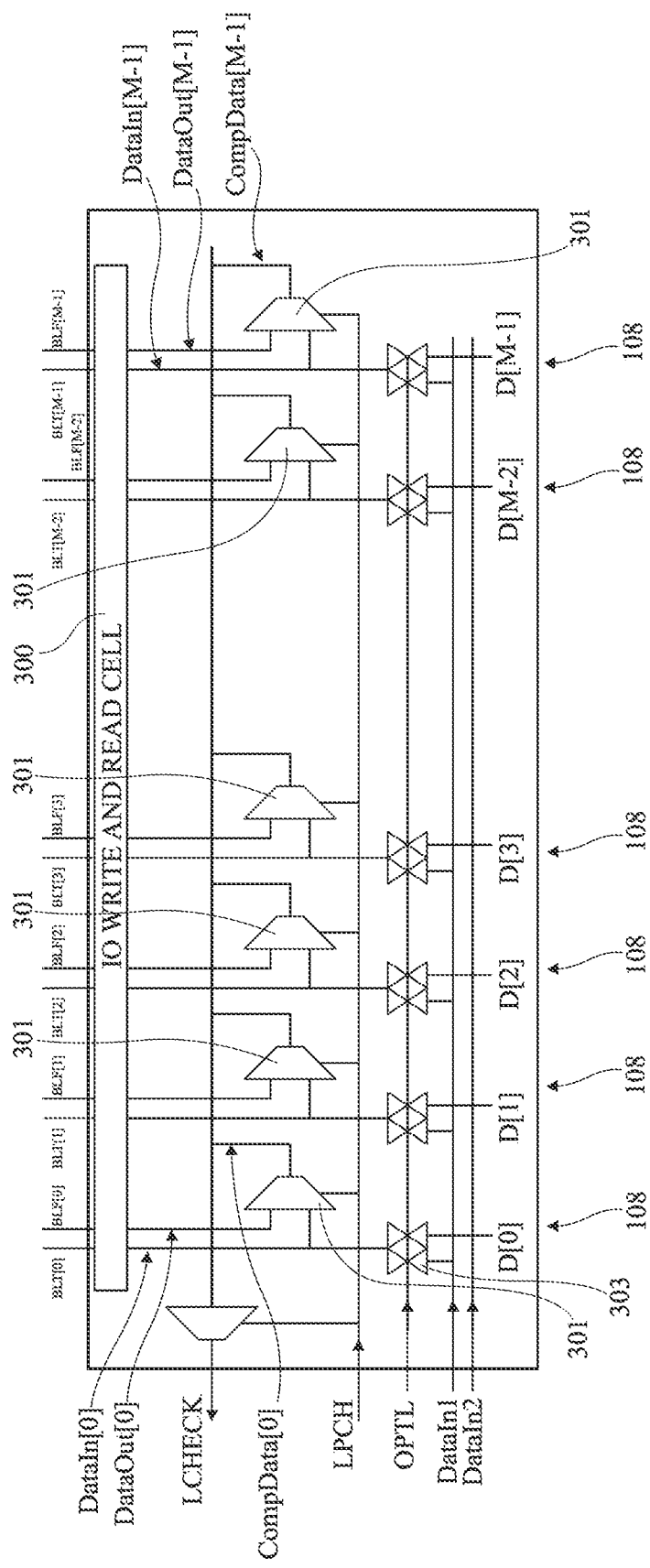
FIG. 8 shows an embodiment of modules of writing, reading and comparison devices of the memory of FIG. 1.

FIG. 8 shows, schematically and in block diagram form, an exemplary embodiment of modules 108 of the devices 106 of the memory 100 described in relation with FIG. 1. In FIG. 8, only a relevant part of the modules 108 has been shown.

Each module 108 receives, as input:
the signals DataIn [0], . . . , DataIn[M−1], and DataOut[0], . . . , DataOut[M−1], coming from read cells 300 (TO WRITE AND READ CELL);
the preload signal LPECH;
the signal MUST;
one of the data signals, DataIn1 or DataIn2, making up the data signals DataIn;
test data signals D[0], . . . , D[M−1]; and
read data signals Q[0], . . . , Q[M−1] in a conventional operating mode, these signals not being shown in FIG. 8.

More specifically, the modules 108 alternatively receive a pair made up of signals (DataIn[0], DataOut[0]), . . . , (DataIn[M−1], DataOut[M−1]). Each module 108 supplies, as output, a bitline comparison signal CompData[0], . . . , CompData[M−1].

Each module 108 comprises, for example, a logic circuit 301 taking, as input, the pair (DataIn[0], DataOut[0]), . . . , (DataIn[M−1], DataOut[M−1]) and supplying, as output, the signal CompData[0], . . . , CompData[M−1]. The circuit 301 is controlled by the signal LPCH.

Each module 108 further comprises a switch with three states (not shown in FIG. 8). This switch is controlled by the signal AJUST and makes it possible either to connect the data signals DataOut[0], . . . , DataOut[M−1] during a read phase of the adjustment phase and to hide the outputs Q[0], . . . , Q[M−1], or to connect the data signals DataOut [0], . . . , DataOut[M−1] to the output signals Q[0], . . . , Q[M−1] in a conventional usage phase.

The signal LCHECK is preloaded in a high state before each comparison. The signal CompData[0], . . . , CompData[M−1] is the local comparison result between the signal DataIn[0], . . . , DataIn[M−1] and the signal DataOut[0], . . . , DataOut[M−1]. Each signal CompData[0], . . . , CompData[M−1] is in a high state when the input and output signals are equal, and is in a low state when they are different. One advantage of this comparison is that it is fast and dense.

Various embodiments and variants have been described. Those skilled in the art will understand that certain features of these embodiments can be combined and other variants will readily occur to those skilled in the art. In particular, the modules 115 and 108 described in relation with FIGS. 7 and 8 are only exemplary embodiments, and other types of modules may be considered by those skilled in the art.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
enabling adjustment of a read margin of a memory; and
in response to the enabling of the adjustment of the read margin of the memory:
setting initial values of one or more read threshold configuration signals associated with a plurality of memory points of the memory;
writing first data in the plurality of memory points;
reading second data from the plurality of memory points;
comparing the second data to the first data;
in response to the comparing indicating the first data and the second data are different, adjusting current values of the one or more read threshold configuration signals to increment the read margin of the memory, and repeating the writing, reading and comparing; and
in response to the comparing indicating the first data and the second data match, storing the current values of the one or more read threshold configuration signals.

2. The method according to claim 1, wherein the first data are written in a row of the memory points.

3. The method according to claim 1, wherein the first data are written successively in all of a plurality of rows of the memory points of the memory.

4. The method according to claim 1, wherein the first data are successively equal to the following data:
a series of binary "0";
an alternation of binary "0" and "1";
an alternation of binary "1" and "0"; and
a succession of binary "1".

5. The method according to claim 1, further comprising:
disabling adjustment of the read margin of the memory.

6. The method according to claim 1, wherein the incrementing the read margin of the memory comprises increasing a margin between a read threshold voltage and a high state voltage.

7. A device, comprising:
a plurality of memory points, which, in operation, store data;
a plurality of bitlines coupled to the memory points; and
a control circuit, which, in operation, responds to enabling of an adjustment of a read margin of the memory by:
setting initial values of one or more read threshold configuration signals associated with the plurality of memory points of the memory;
writing first data in the plurality of memory points;
reading second data from the plurality of memory points;
comparing the second data to the first data;
in response to the comparing indicating the first data and the second data are different, adjusting current values of the one or more read threshold configuration signals to increment the read margin of the memory, and repeating the writing, reading and comparing; and
in response to the comparing indicating the first data and the second data match, storing the current values of the one or more read threshold configuration signals.

8. The device according to claim 7, wherein the memory points are latches.

9. The device according to claim 7, wherein the control circuit, in operation, increments the read margin of the memory by increasing a margin between a read threshold voltage and a high state voltage.

10. The device according to claim 7, wherein the control circuit is further configured to:
generate an adjustment phase activation signal to enable adjustment of the read margin of the memory; and
generate an adjustment phase end signal to disable adjustment of the read margin of the memory.

11. A memory device, comprising:
a plurality of memory points, which, in operation, store data;
a plurality of bitlines coupled to the memory points;
a read and write circuit, which, in operation, reads and writes data in the memory points; and
a control circuit coupled to the read and write circuit, wherein the control circuit, in a read margin adjustment phase of operation:
sets initial values of one or more read threshold configuration signals associated with the plurality of memory points of the memory;
causes the read and write circuit to write first data into the plurality of memory points;
causes the read and write circuit to read second data from the plurality of memory points;
compares the second data to the first data;
in response to the comparing indicating the first data and the second data are different, adjusts current values of the one or more read threshold configuration signals to increment a read margin of the memory, and repeats the causing of the writing, the causing of the reading and the comparing; and
in response to the comparing indicating the first data and the second data match, stores the current values of the one or more read threshold configuration signals.

12. The memory device according to claim 11, wherein the read and write circuit is configured to write the first data in a row of the memory points.

13. The memory device according to claim 11, wherein the read and write circuit is configured to write the first data successively in all of a plurality of rows of the memory points of the memory.

14. The memory device according to claim 11, wherein the first data are successively equal to the following data:
a series of binary "0";
an alternation of binary "0" and "1";
an alternation of binary "1" and "0"; and
a succession of binary "1".

15. The memory device according to claim 11, wherein the control circuit is further configured to:
generate an adjustment phase activation signal; and
generate an adjustment phase end signal.

16. The memory device according to claim 11, wherein the control circuit is configured to increment the read marging by increasing a margin between a read threshold voltage and a high state voltage.

17. The memory device according to claim 11, wherein the memory points are latches.

18. A non-transitory computer-readable medium having contents which configure a controller of a memory to perform a method, the method comprising:
enabling adjustment of a read margin of a memory; and
in response to the enabling of the adjustment of the read margin of the memory:

setting initial values of one or more read threshold configuration signals associated with a plurality of memory points of the memory;

writing first data in the plurality of memory points;

reading second data from the plurality of memory points;

comparing the second data to the first data;

in response to the comparing indicating the first data and the second data are different, adjusting current values of the one or more read threshold configuration signals to increment the read margin of the memory, and repeating the writing, reading and comparing; and in response to the comparing indicating the first data and the second data match, storing the current values of the one or more read threshold configuration signals.

19. The non-transitory computer-readable medium of claim 18, wherein the method comprises:

disabling adjustment of the read margin of the memory.

20. The non-transitory computer-readable medium according to claim 18, wherein the incrementing the read margin of the memory comprises increasing a margin between a read threshold voltage and a high state voltage.

* * * * *